United States Patent
Chu et al.

(10) Patent No.: US 12,419,073 B2
(45) Date of Patent: Sep. 16, 2025

(54) DEVICE HAVING A GATE ELECTRODE WRAPPING AROUND SEMICONDUCTOR LAYERS AND PROXIMATE TO A DIELECTRIC FIN

(71) Applicant: TAIWAN SEMICONDUCTOR MANUFACTURING COMPANY, LTD., Hsinchu (TW)

(72) Inventors: Lung-Kun Chu, New Taipei (TW); Mao-Lin Huang, Hsinchu (TW); Chung-Wei Hsu, Hsinchu County (TW); Jia-Ni Yu, New Taipei (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 536 days.

(21) Appl. No.: 17/875,194

(22) Filed: Jul. 27, 2022

(65) Prior Publication Data

US 2022/0367689 A1    Nov. 17, 2022

Related U.S. Application Data

(62) Division of application No. 17/087,131, filed on Nov. 2, 2020, now Pat. No. 11,637,195.

(51) Int. Cl.
H10D 30/01    (2025.01)
H10D 30/62    (2025.01)
(Continued)

(52) U.S. Cl.
CPC ....... *H10D 30/024* (2025.01); *H10D 30/0243* (2025.01); *H10D 30/6211* (2025.01);
(Continued)

(58) Field of Classification Search
CPC ....... H10D 30/43–435; H10D 30/6757; H10D 30/6735; H10D 30/501–509;
(Continued)

(56) References Cited

U.S. PATENT DOCUMENTS 8,796,666 B1    8/2014  Huang et al.
8,822,243 B2    9/2014  Yan et al.
(Continued)

*Primary Examiner* — Younes Boulghassoul
(74) *Attorney, Agent, or Firm* — HAYNES AND BOONE, LLP

(57) ABSTRACT

A device according to the present disclosure includes a fin structure disposed on a substrate and including a stack of semiconductor layers that are separated from each other, a dielectric fin disposed on the substrate, a spacer layer disposed on a sidewall of the dielectric fin and extending below the dielectric fin such that the spacer layer prevents the dielectric fin from interfacing with the substrate, an interfacial layer wrapping around each semiconductor layer of the stack, a gate dielectric layer disposed on the interfacial layer wrapping around each semiconductor layer of the stack, and a gate electrode layer including a first portion wrapping around the gate dielectric layer disposed on the interfacial layer and a second portion extending along the spacer layer disposed on the dielectric fin. An airgap extends between the first portion of the gate electrode layer and the second portion of the gate electrode layer.

20 Claims, 7 Drawing Sheets

(51) Int. Cl.
*H10D 30/67* (2025.01)
*H10D 62/10* (2025.01)
*H10D 84/01* (2025.01)
*H10D 84/03* (2025.01)

(52) U.S. Cl.
CPC ..... *H10D 30/6735* (2025.01); *H10D 30/6757* (2025.01); *H10D 62/121* (2025.01); *H10D 84/0135* (2025.01); *H10D 84/014* (2025.01); *H10D 84/0147* (2025.01); *H10D 84/0151* (2025.01); *H10D 84/0158* (2025.01); *H10D 84/0172* (2025.01); *H10D 84/038* (2025.01); *H10D 84/0177* (2025.01); *H10D 84/0188* (2025.01)

(58) Field of Classification Search
CPC ..... H10D 30/014; H10D 30/019–0198; H10D 62/119–123; H10D 84/851; H10D 84/852; H10D 84/832; H10D 84/833; H10D 84/0135; H10D 84/014; H10D 84/0142; H10D 84/0172; H10D 84/0177; H10D 84/0179; H10D 64/017; H10D 64/517; H10D 64/518; H10D 30/673; H10D 62/115; H10D 62/116; H10D 84/0151; H10D 84/0153; H10D 84/0188; H10D 30/0243; H01L 21/28114; H01L 21/76224; H01L 21/76229; H01L 21/76232
See application file for complete search history.

(56) References Cited

U.S. PATENT DOCUMENTS

| | | |
|---|---|---|
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 10,510,620 B1 | 12/2019 | Chanemougame et al. |
| 11,145,734 B1* | 10/2021 | Yu ................ H10D 30/031 |
| 11,615,962 B2* | 3/2023 | Hsu ................ H01L 29/78696 257/351 |
| 2020/0266192 A1* | 8/2020 | Ju ................ H01L 21/823481 |
| 2020/0294863 A1* | 9/2020 | Chiang ................ A23B 2/783 |
| 2020/0328208 A1 | 10/2020 | Chiang et al. |
| 2020/0343377 A1* | 10/2020 | Chiang ................ H10D 64/017 |
| 2021/0028068 A1 | 1/2021 | Dentoni Litta et al. |
| 2021/0057525 A1* | 2/2021 | Chiang ................ H01L 21/3086 |
| 2021/0119021 A1 | 4/2021 | Colombeau et al. |
| 2021/0159311 A1* | 5/2021 | Lan ................ H01L 29/42392 |
| 2021/0272856 A1* | 9/2021 | Pan ................ H10D 84/85 |
| 2021/0273075 A1* | 9/2021 | Pan ................ H10D 84/0158 |
| 2021/0305361 A1 | 9/2021 | Pranatharthi Haran et al. |
| 2021/0335671 A1 | 10/2021 | Wang |
| 2021/0336024 A1* | 10/2021 | Chen ................ H01L 29/0673 |
| 2021/0343713 A1* | 11/2021 | Ju ................ H01L 29/66545 |
| 2021/0375858 A1* | 12/2021 | Chiang ................ H10D 84/038 |
| 2021/0376093 A1* | 12/2021 | Chu ................ H01L 29/42392 |
| 2022/0013410 A1* | 1/2022 | You ................ H01L 21/76897 |
| 2022/0029024 A1* | 1/2022 | More ................ H10D 84/85 |
| 2022/0045051 A1* | 2/2022 | You ................ H01L 29/78696 |
| 2022/0059678 A1* | 2/2022 | Jhan ................ H01L 29/66545 |
| 2022/0115530 A1* | 4/2022 | Lu ................ H01L 29/775 |
| 2022/0140115 A1 | 5/2022 | Chu et al. |

* cited by examiner

DEVICE HAVING A GATE ELECTRODE WRAPPING AROUND SEMICONDUCTOR LAYERS AND PROXIMATE TO A DIELECTRIC FIN

PRIORITY DATA

The present application is a divisional application of U.S. patent application Ser. No. 17/087,131, filed Nov. 2, 2020, which is incorporated herein by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices, having a gate structure on at least two sides of a channel region, have been observed to increase gate-channel coupling, reduce OFF-state current, and/or reduce short-channel effects (SCEs). One such multigate device is the gate-all around (GAA) device, which includes a gate structure that extends fully around a channel region. GAA devices enable aggressive scaling down of IC dimensions, maintaining gate control and mitigating SCEs, while seamlessly integrating with conventional IC manufacturing processes. As GAA devices continue to scale, increasing device density has become more difficult with current metal gate etching techniques.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
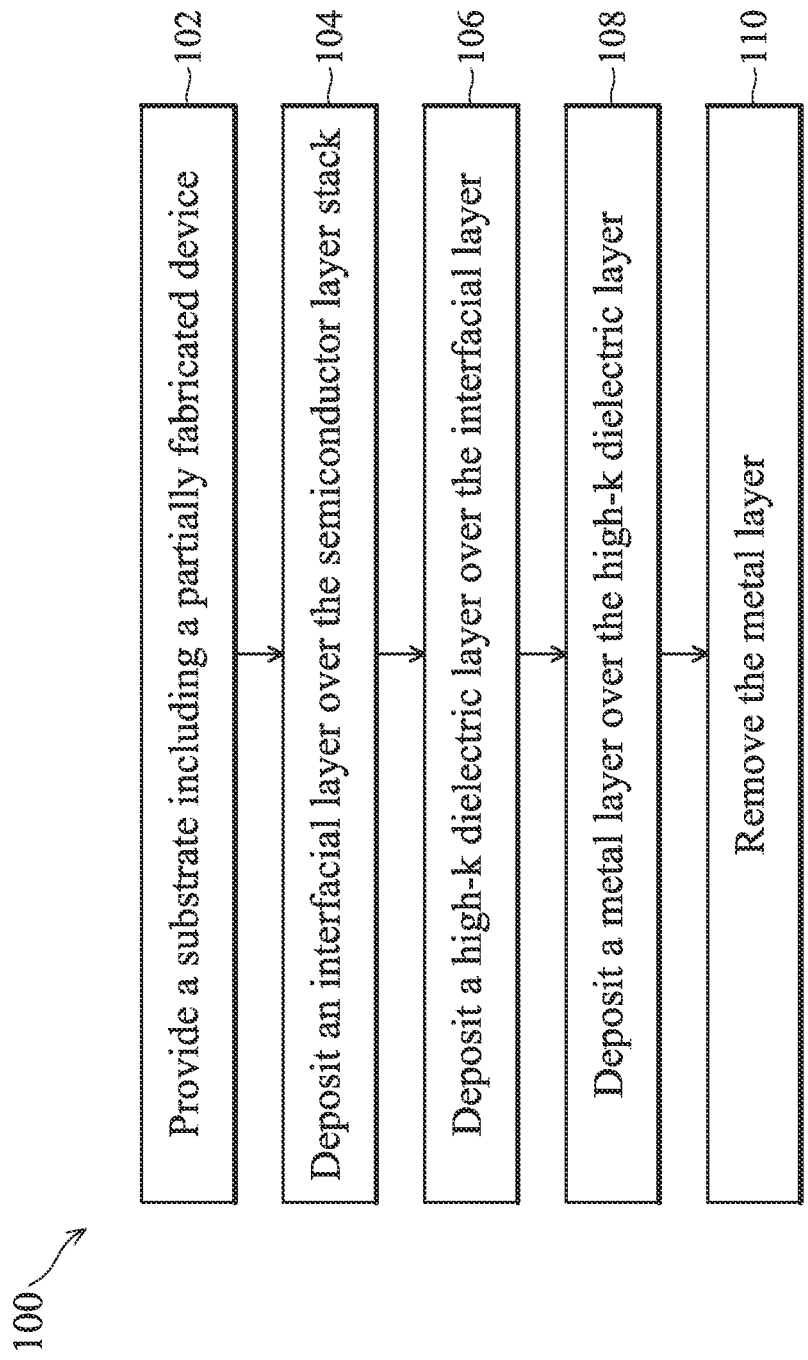
FIG. 1 is a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multigate transistors include those transistors whose gate structures are formed on at least two-sides of a channel region. These multi-gate devices may include a P-type metal-oxide semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures which provide an advanced spacing scheme to aid in self-aligned gate patterning. In various embodiments, the disclosed spacing scheme may allow devices to be formed closer together, with tighter spacing requirements, allowing for more devices to be formed on a single wafer. In some embodiments, the spacing requirements described below allow for better self-aligned metal gate patterning than was previously available using conventional techniques. Other embodiments and advantages will be evident to those skilled in the art upon reading the present disclosure.

FIG. 1 is a flow chart of a method 100 for fabricating a multigate device according to various aspects of the present disclosure. In some embodiments, method 100 provides a method for fabricating a multi-gate device using a self-aligned metal gate patterning process. The method 100 is discussed below with reference to fabrication of GAA devices. However, it will be understood that aspects of the method 100 may be equally applied to other types of multigate devices, or to other types of devices implemented by the multigate devices, without departing from the scope of the present disclosure. It is understood that the method 100 includes steps having features of a complementary metal-oxide-semiconductor (CMOS) technology process flow and thus, are only described briefly herein. Also, additional steps may be performed before, after, and/or during the method 100.

Figures 2A, 2B, 2C:
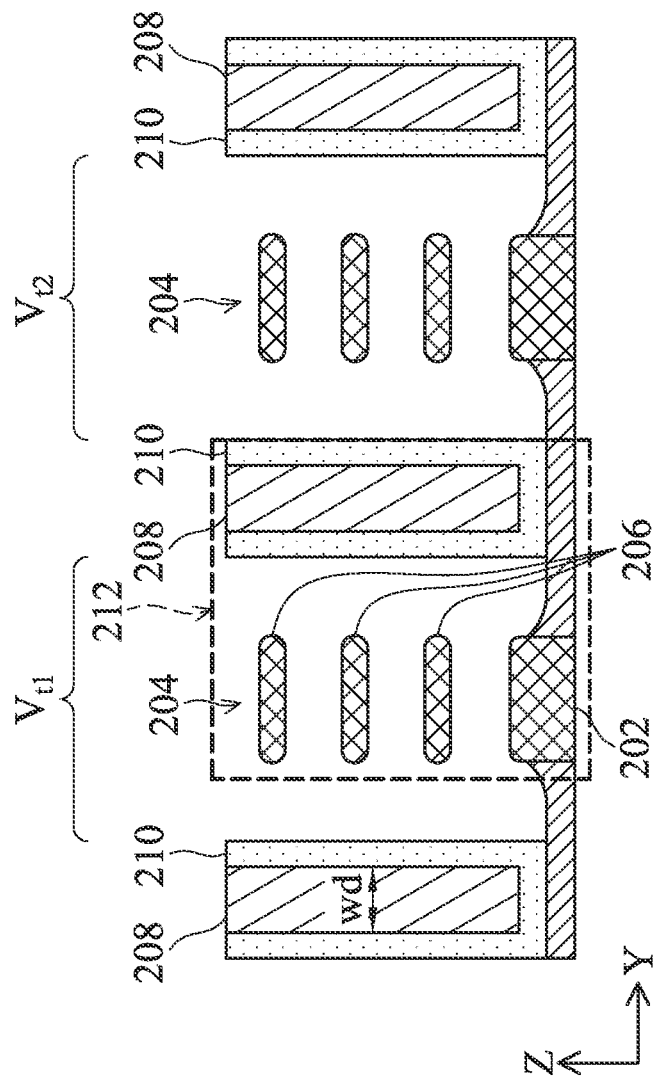
FIG. 2A provides a simplified top-down layout view of a multi-gate device, in accordance with some embodiments.
FIGS. 2B, 3A, 4A, 5A, 6A, and 7A provide cross-sectional views of an embodiment of a multigate device 200 along a plane A-A' of FIG. 2A.
FIGS. 2C, 3B, 4B, 5B, 6B, and 7B provide cross-sectional views of an embodiment of the multigate device 200 along a plane B-B' of FIG. 2A.

The method 100 begins at block 102 where a partially fabricated multigate device 200 is provided. Referring to the example of FIGS. 2A-2C, in an embodiment of block 102, a partially fabricated multigate device 200 is provided. FIG. 2A provides a top view of the multigate device 200 in an X-Y plane; FIG. 2B provides a diagrammatic cross-sectional view of the multigate device 200 in an X-Z plane along plane A-A' of FIG. 2A; and FIG. 2C provides a diagrammatic cross-sectional view of the multigate device 200 in an Y-Z plane along plane B-B' of FIG. 2A. As shown in FIG. 2A, the multigate device 200 is formed over a substrate and includes a plurality of fins 204, a plurality of dielectric fins 208, and a plurality of gate spacers 210. For simplicity only two fins 204, three dielectric fins 208, and two gate spacers 210 are shown in FIG. 2A. However, it will be understood that multigate device 200 can contain many more fins, dielectric fins, and gate spacers as required. The fins 204 are perpendicular to the gate spacers 210 and the gate spacers 210 are separated by the dielectric fins. Additionally, the fins 204 are spaced between the dielectric fins 208 along the plane B-B', as will be discussed further below.

As shown in FIGS. 2B and 2C, the multigate device 200 includes fins 204 having a substrate portion 202 (formed from the substrate) and semiconductor layers 206. In the depicted embodiment, the substrate and substrate portion 202 include silicon. Alternatively or additionally, the substrate and substrate portion 202 include another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate and substrate portion 202 can include various doped regions depending on design requirements of the multigate device 200.

The fins 204 extend from and are disposed over the substrate 202 in channel regions of multigate device 200. Channel regions are disposed between respective source/drain (S/D) regions of the multigate device 200. As depicted in FIG. 2C, fins 204 include a plurality of semiconductor layers 206, stacked vertically (e.g., along the z-direction). In some embodiments, fins 204 are formed by epitaxially growing a first type of semiconductor layers (e.g., the semiconductor layers 206) and a second type of semiconductor layers in an interleaving and alternating configuration. For example, a first one of the second type of semiconductor layers is epitaxially grown on the substrate portion 202 of the fin 204, a first one of the semiconductor layers 206 is epitaxially grown on the first one of the second type of semiconductor layers, a second one of the second type of semiconductor layers is epitaxially grown on the first one of the semiconductor layers 206, and so on until the fins 204 have a desired number of the first type of semiconductor layers (e.g., the semiconductor layers 206) and the second type of semiconductor layers. In some embodiments, the first and second type of semiconductor layers can be referred to as epitaxial layers. In some embodiments, epitaxial growth of the first and second type of semiconductor layers is achieved by a molecular beam epitaxy (MBE) process, a chemical vapor deposition (CVD) process, a metalorganic chemical vapor deposition (MOCVD) process, other suitable epitaxial growth process, or combinations thereof.

Still referring to FIG. 2C, the second type of semiconductor layers are then selectively removed from the channel regions of the multigate device 200, thereby leaving the semiconductor layers 206, which define channel layers for the multigate device 200. In the depicted embodiment, removing the second type of semiconductor layers provides three channel layers (e.g., the semiconductor layers 206) through which current will flow between respective epitaxial source/drain features during operation of the multigate device 200. In some embodiments, removal of the second type of semiconductor layers may be referred to as a channel release process. In some embodiments, each channel layer (e.g., the semiconductor layer 206) has nanometer-sized dimensions and can be referred to as a nanowire. Portions of the illustrated nanowire channel layer (e.g., the semiconductor layers 206) are suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, after removing the second type of semiconductor layers, an etching process may be performed to modify a profile of channel layers (e.g., the semiconductor layers 206) to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 206 (nanowires) have sub-nanometer dimensions depending on design requirements of the multigate device 200.

In some embodiments, an etching process selectively etches the second type of semiconductor layers with minimal (to no) etching of the semiconductor layers 206. Various etching parameters can be tuned to achieve selective etching of the second type of semiconductor layers, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of the second type of semiconductor layers (e.g., silicon germanium) at a higher rate than the material of the semiconductor layers 206 (e.g., silicon) (i.e., the etchant has a high etch selectivity with respect to the material of the second type of semiconductor layers). The etching process is a dry etching process, a wet etching process, other suitable etching process, or combinations thereof. In some embodiments, a dry etching process (such as an RIE process) utilizes a fluorine-containing gas (for example, $SF_6$) to selectively etch the second type of semiconductor layers. In some embodiments, a ratio of the fluorine-containing gas to an oxygen-containing gas (for example, $O_2$), an etching temperature, and/or an RF power may be tuned to selectively etch silicon germanium. In some embodiments, a wet etching process utilizes an etching solution that includes ammonium hydroxide ($NH_4OH$) and water ($H_2O$) to selectively etch the second type of semiconductor layers. In some embodiments, a chemical vapor phase etching process using hydrochloric acid (HCl) selectively etches the second type of semiconductor layers. Although three layers of semiconductor layer 206 are depicted, it is understood that there can be more or fewer semiconductor layers 206 in the fins 204.

In some embodiments, dielectric fins 208 are disposed adjacent to the fins 204 in the channel region depicted in FIG. 2C. In some embodiments, the dielectric fins 208 are formed by filling trenches adjacent to the fins 204 (deposited over each of the fins). In various cases, the dielectric fins 208 may be deposited by a CVD process, an ALD process, a PVD process, and/or other suitable process. In some examples, after depositing the dielectric fin 208 material a CMP process may be performed to remove excess material portions and to planarize a top surface of the device 200. In some embodiments, the dielectric fins 208 may include a low-K (LK) material including SiCN, SiOC, SiOCN, or another low-K material (e.g., with a dielectric constant 'k'<7). In some examples the dielectric fin 208 may include a high-K (HK) material including $HfO_2$, $ZrO_2$, HfAlOx, HfSiOx, $Al_2O_3$, or another high-K material (e.g., with a dielectric constant 'k'>7). The dielectric fins 208 have a width wd. In some embodiments, the width wd is between about 7 nm to about 14 nm. In some embodiments, the dielectric fins 208 aid in a self-aligning metal-gate etching process, as described in more detail below.

Gate spacers 210 are disposed adjacent to (i.e., along sidewalls of) the dielectric fins 208 and disposed over a top semiconductor layer 206. In some embodiments, the gate spacers 210 may be formed prior to the dielectric fins 208. The gate spacers 210 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over multigate device 200 and subsequently etched (e.g., anisotropically etched) to form the gate spacers 210. In some embodiments, the gate spacers 210 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the dielectric fins 208. In such implementations, the various sets of spacers can include materials having different etch rates. For example, a first dielectric layer including silicon and oxygen (e.g., silicon oxide) can be deposited and etched to provide a first spacer set adjacent to the dielectric fins 208, and a second dielectric layer including silicon and nitrogen (e.g., silicon nitride) can be deposited and etched to form a second spacer set adjacent to the first spacer set.

Continuing with FIG. 2C, a region $V_{t1}$ and a region $V_{t2}$ are depicted. In some embodiments, region $V_{t1}$ has the same gate composition as region $V_{t2}$. In some embodiments of the methods and techniques described below, a first metal layer is deposited over the regions $V_{t1}$ and $V_{t2}$. A second metal layer is then deposited over the regions $V_{t1}$ and $V_{t2}$. A hard mask is then formed over regions $V_{t1}$ and $V_{t2}$. The hard mask is patterned to remove a portion of the hard mask from over region $V_{t1}$, while the region $V_{t2}$ remains protected by the hard mask. An etching process is performed to remove the second metal layer from the region $V_{t1}$. After the hard mask is removed, the regions $V_{t1}$ and $V_{t2}$ remain, each having a different metal gate stack. In some embodiments, the different metal gate stacks create a different voltage threshold for devices formed in each of the region $V_{t1}$ and the region $V_{t2}$.

FIGS. 3A-7A and 3B-7B are diagrammatic cross-sectional views of the multigate device 200, in portion or entirety, at various stages of fabrication (such as those associated with method 100 in FIG. 1) according to various aspects of the present disclosure. In particular, FIGS. 3A-7A are diagrammatic cross-sectional views of the multigate device 200 in an X-Z plane along plane A-A' of FIG. 2A and FIGS. 3B-7B are diagrammatic cross-sectional views of the multigate device 200 in an Y-Z plane along plane B-B' of FIG. 2A, showing only a portion 212 of FIG. 2C that includes a single fin 204 and the region $V_{t1}$. It should be noted that FIGS. 3B-7B show the portion 212 of FIG. 2C corresponding to region $V_{t1}$ for clarity and description purposes only. The methods and techniques described below may be used for making region $V_{t2}$ or any other device that is part of the multigate device 200. The embodiments of the present description and the techniques discussed herein may be used on all fins and areas of the multigate device 200.

Figure 3B:
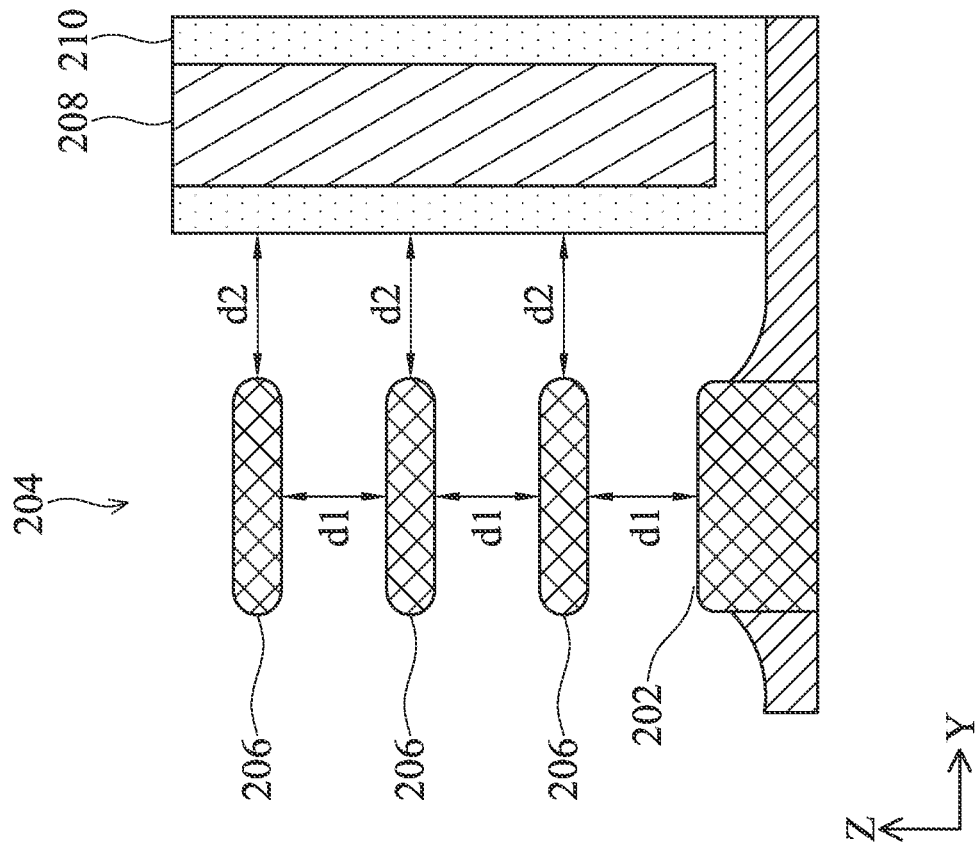
Figure 3A:
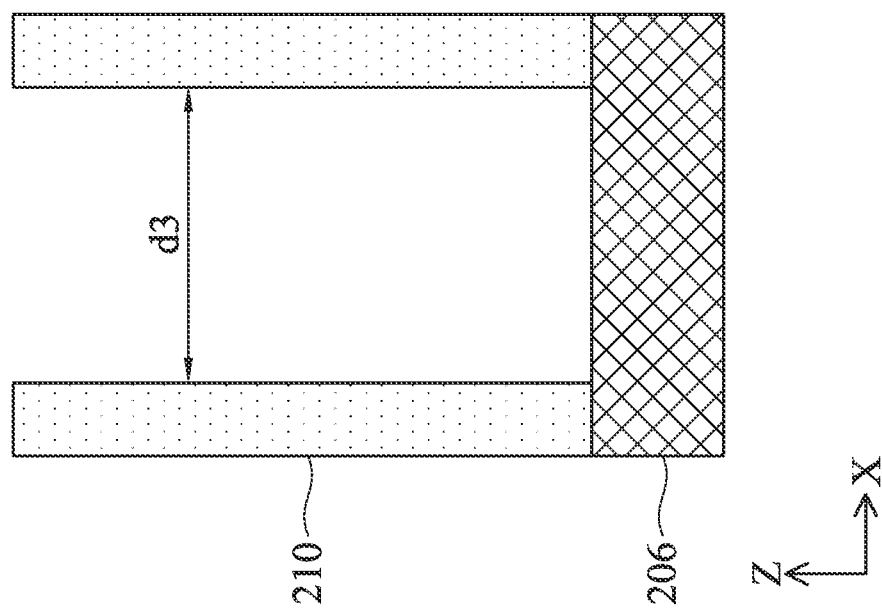

Turning to FIG. 3A, a cross-sectional diagram of the multigate device 200 in the X-Z plane along plane A-A' of FIG. 2A, as described above, is shown. An upper portion of the multigate device 200, specifically the top semiconductor layer 206 of fin 204, is depicted in FIG. 3A. In the depicted embodiment, gate spacers 210 are disposed on the top semiconductor layer 206 of fin 204. Gate spacers 210 extend in a first direction (e.g. the Y direction) parallel a top surface of the substrate.

Turning to FIG. 3B, a cross-sectional diagram of the multigate device 200 in the Y-Z along plane B-B' of FIG. 2A, as described above, is shown. FIG. 3B depicts the portion 212 of FIG. 2C, as described above, including the fin 204 disposed over the substrate. Fin 204 includes a substrate portion 202 and semiconductor layers 206 stacked vertically (e.g. the Z direction) over the substrate portion 202. The semiconductor layers 206 have a first distance d1, or sheet to sheet distance, between adjacent semiconductor layers 206. In the depicted embodiment, a top surface of the substrate portion 202 of fin 204 is separated from a bottom surface of the bottom most semiconductor layer 206 by first distance d1. The first distance d1 is selected to guarantee that a subsequently deposited metal gate layer merges between adjacent semiconductor layers 206, as discussed below. A merged metal gate layer ensures proper etching, as described below. Furthermore, the first distance d1 is a base distance that is used to determine the other distances as is discussed below. In some embodiments, the first distance d1 between each semiconductor layer 206 is about 8 nm to about 13 nm. In some embodiments, the epitaxial growth process of semiconductor layers 206 is tuned to ensure that first distance d1 is sufficiently sized. In some embodiments, the etching process to remove the second semiconductor layer is tuned to ensure that first distance d1 is sufficiently sized.

In some embodiments, the dielectric fin 208 is disposed adjacent to the fin 204 and the gate spacer 210 is disposed adjacent (i.e. along the sidewalls) to the dielectric fin 208. In some embodiments, a second distance d2, or end cap distance, separates each semiconductor layer 206 of the fin 204 from the gate spacer 210. The second distance d2 is selected to be larger than the first distance d1 to guarantee that a subsequently deposited metal gate layer merges between adjacent semiconductor layers 206 as described below. A merged metal gate layer is ensures proper etching, as described below. The second distance d2 should be at least 2 nm larger than the first distance d1. In some embodiments, second distance d2 between the semiconductor layers 206 of the fin 204 and the gate spacer 210 is about 10 nm to about 15 nm. In some embodiments, the dielectric fin 208 formation process is tuned to ensure that second distance d2 is sufficiently sized. In some embodiments, the gate spacer 210 deposition process is tuned to ensure that the second distance d2 is sufficiently sized.

Returning to FIG. 3A, the gate spacers 210 are substantially parallel to one another and are separated by a third distance d3. In some embodiments, a third distance d3, or gate length (LG), extends from a first gate spacer 210 to a second gate spacer 210 in a second direction (e.g. the X direction) that is perpendicular to the first direction and parallel to the top surface of substrate. The third distance d3 is selected to be larger than the first distance d1 to guarantee that a subsequently deposited metal gate layer merges between adjacent semiconductor layers 206 as described below. A merged metal gate layer ensures proper etching, as described below. The third distance d3 should be at least 1 nm larger than the first distance d1. In some embodiments, third distance d3 may be about 9 nm to about 14 nm. In some embodiments, the gate spacer 210 deposition process is tuned to ensure that third distance d3 is sufficiently sized.

As discussed above, the relationship between the first distance d1, the second distance d2, and the third distance d3 guarantees that a subsequently deposited metal layer, when formed, will merge between adjacent semiconductor layers 206, as discussed further below. In an example, if first distance d1 is "N", then second distance d2 is "N+2" and third distance d3 is "N+1". In other words, the second distance d2 is about 2 nm larger than the first distance d1 and the third distance d3 is about 1 nm larger than the first distance d1. In some embodiments, the third distance d3 is about 1 nm larger than the first distance d1 and the second distance d2 is about 1 nm larger than the third distance d3. In some embodiments, the third distance d3 is at least 1 nm larger than the first distance d1 and the second distance d2 is at least 2 nm larger than the first distance d1.

Figure 4B:
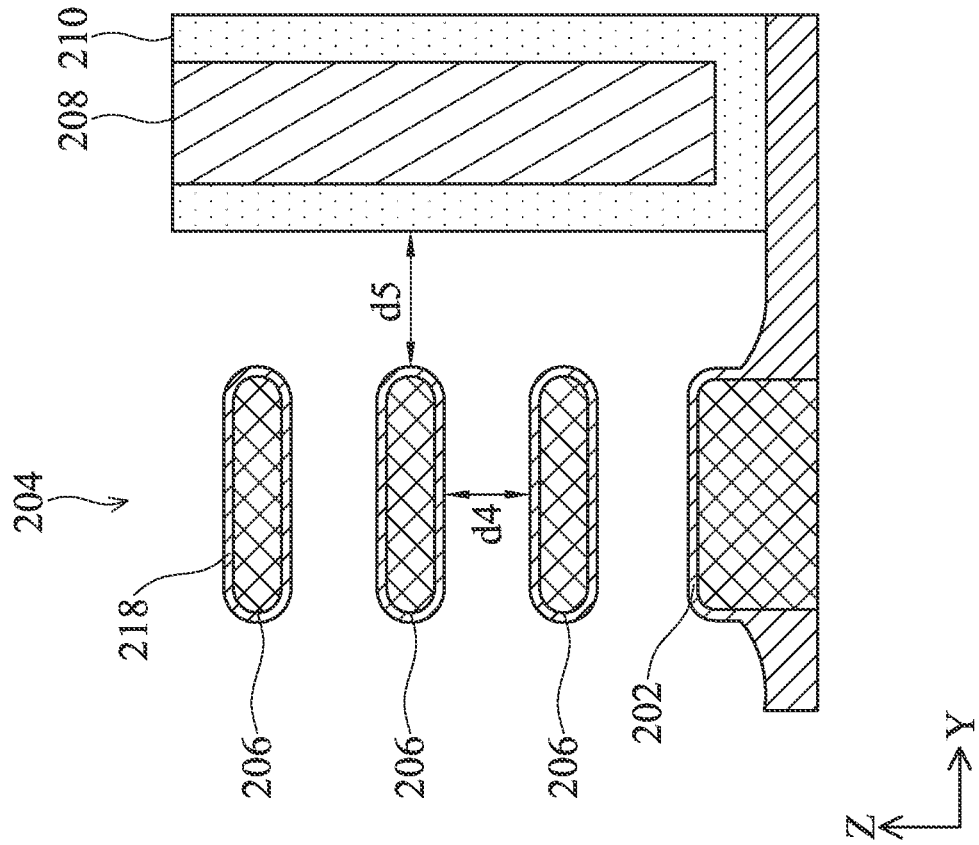
Figure 4A:
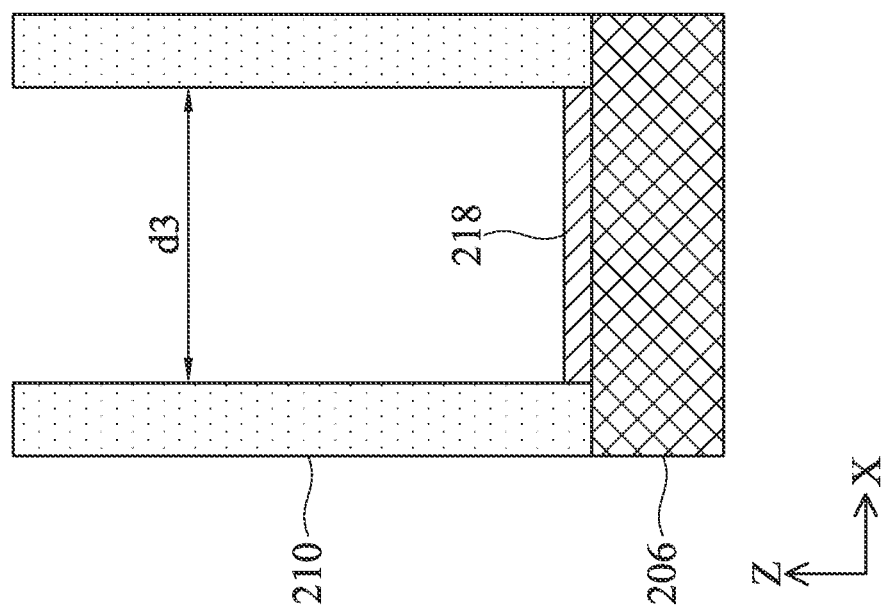

The method 100 then proceeds to block 104 where an interfacial layer is deposited over the semiconductor layers. Turning to FIGS. 4A and 4B, an interfacial layer 218 is formed on the semiconductor layers 206, including wrapping (surrounding) semiconductor layers 206 and substrate portion 202 in the channel region. In various embodiments, the interfacial layer 218 is not formed on gate spacers 218.

Although only one fin 204 and one dielectric fin 208 are depicted, interfacial layer 218 may be deposited over all channel regions of the multigate device 200, such as, for example, the region $V_{t1}$ and the region $V_{t2}$ depicted in FIG. 2C. In some embodiments, the interfacial layer 218 may include a dielectric material such as silicon oxide ($SiO_2$), aluminum oxide (AlOx), HfSiO, silicon oxynitride (SiON), combinations thereof, or other suitable material. Interfacial layer 218 may be formed by chemical oxidation, thermal oxidation, atomic layer deposition (ALD), chemical vapor deposition (CVD), and/or other suitable method. In some embodiments, interfacial layer 218 may be formed to a thickness of about 1 nm. In other embodiments, interfacial layer 218 may be formed to a thickness of between about 0.5 nm to about 2 nm. A portion of interfacial layer 218 disposed on semiconductor layers 206 are vertically (e.g. the Z direction) separated by a fourth distance d4 which is smaller than first distance d1. In some embodiments, fourth distance d4 is about 2 nm less than first distance d1. In some embodiments, fourth distance d4 is smaller than first distance d1 by twice the thickness of the interfacial layer 218. A portion of the interfacial layer 218 disposed on the semiconductor layer 206 is horizontally (e.g. the Y direction) separated from the gate spacer 210 by a fifth distance d5 which is smaller than the second distance d2. In some embodiments, the fifth distance d5 is less than the second distance d2 by about the thickness of the interfacial layer 218.

Figure 5B:
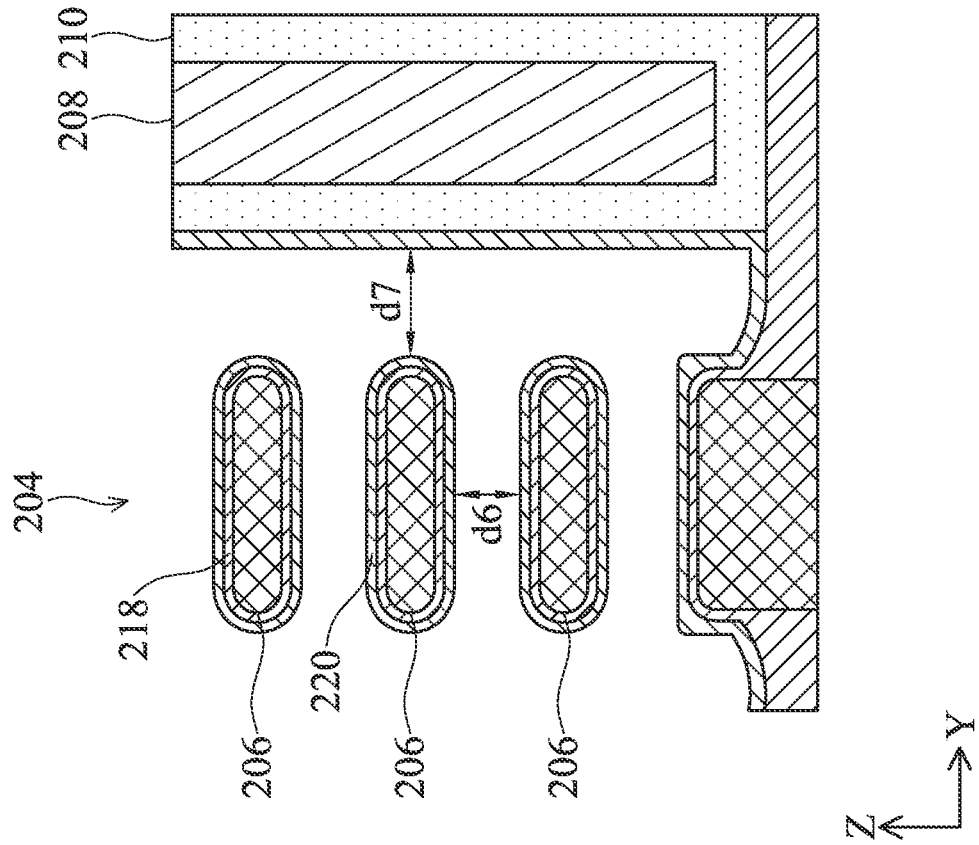
Figure 5A:
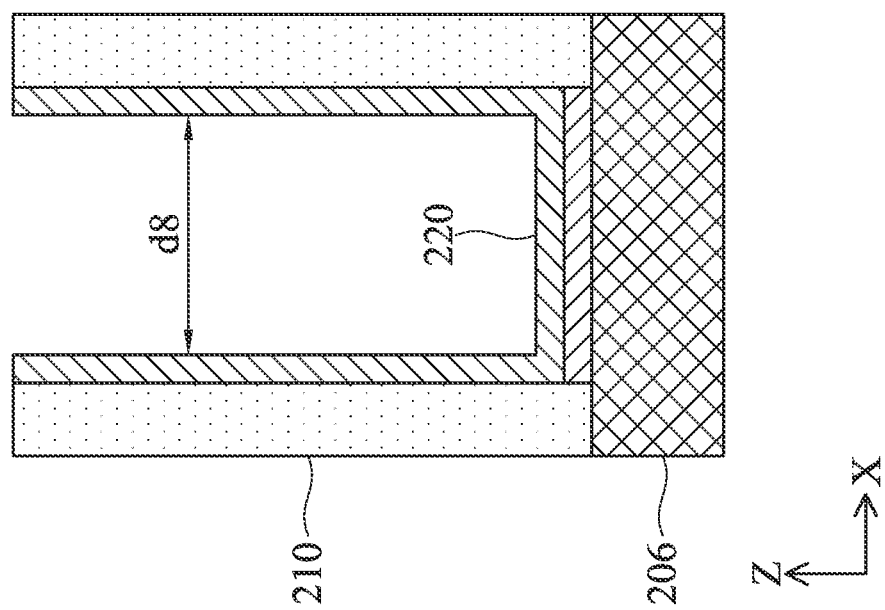

The method 100 then proceeds to block 106 where a high-k dielectric layer is deposited over the interfacial layer. Turning to FIGS. 5A and 5B, a high-k dielectric layer 220 is formed over the interfacial layer 218 and over (i.e. along the sidewalls) the gate spacers 210. High-k dielectric layer 220 includes a high-k dielectric material, such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric materials generally refers to dielectric materials having a high dielectric constant, for example, greater than that of silicon oxide (k≈3.9). High-k dielectric layer 220 is formed by any of the processes described herein, such as ALD, CVD, PVD, oxidation-based deposition process, other suitable process, or combinations thereof. In some embodiment, the high-k dielectric layer 220 is formed to a thickness of about 1.5 nm. In some embodiments, the high-k dielectric layer 220 is formed to a thickness of between about 1 nm to about 2.5 nm.

In some embodiments, a first portion of high-k dielectric layer 220 disposed over a bottom surface of semiconductor layer 206 is separated by a second portion of high-k dielectric layer 220 disposed over a top surface of an adjacent semiconductor layer 206 by a sixth distance d6 where the sixth distance d6 is smaller than the fourth distance d4. In some embodiments, the sixth distance d6 is smaller than the fourth distance d4 by about twice the thickness of the high-k dielectric layer 220. In some embodiments, a third portion of high-k dielectric layer 220 disposed on a sidewall of semiconductor layer 206 is separated from a fourth portion of high-k dielectric layer 220 disposed on a sidewall of the gate spacer 210 by a seventh distance d7 which is less than the fifth distance d5. In some embodiments, the seventh distance d7 is smaller than the fifth distance d5 by about twice the thickness of the high-k dielectric layer 220. In some embodiments, the distance between the fourth portion of high-k dielectric layer 220 and a fifth portion of high-k dielectric layer 220 disposed on an opposing sidewall of gate spacer 210 is an eighth distance d8 which is smaller than the third distance d3. In some embodiments, the eighth distance d8 is smaller than the third distance d3 by about twice the thickness of high-k dielectric layer 220.

Figure 6B:
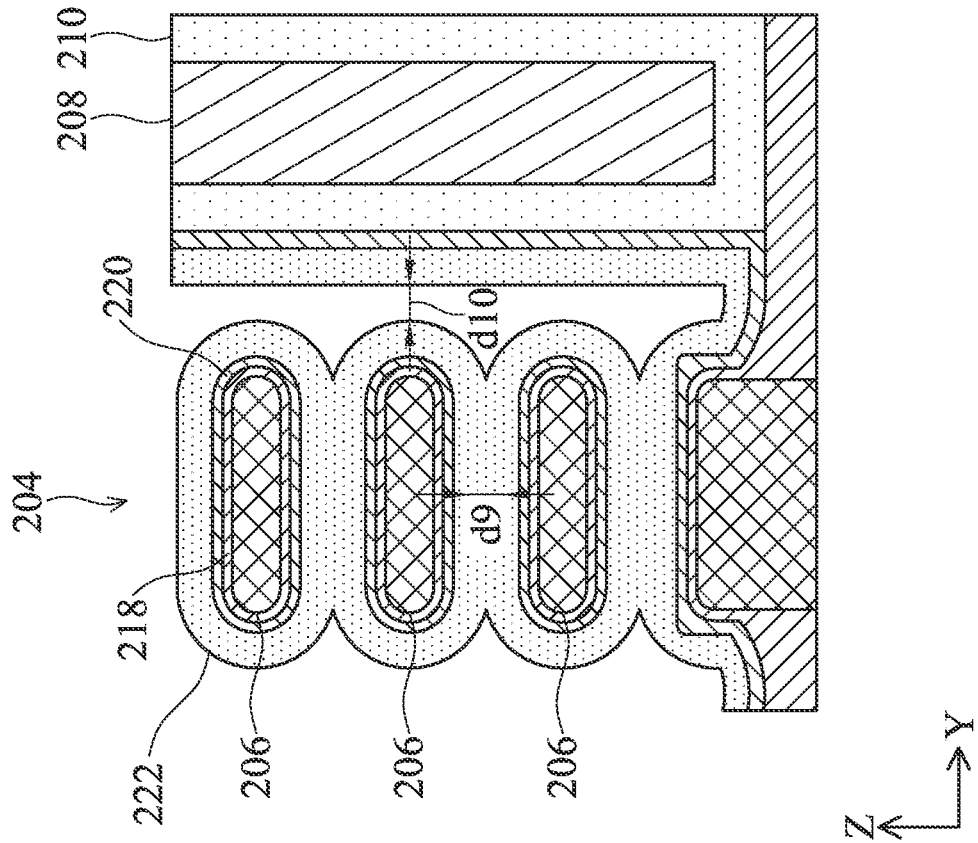
Figure 6A:
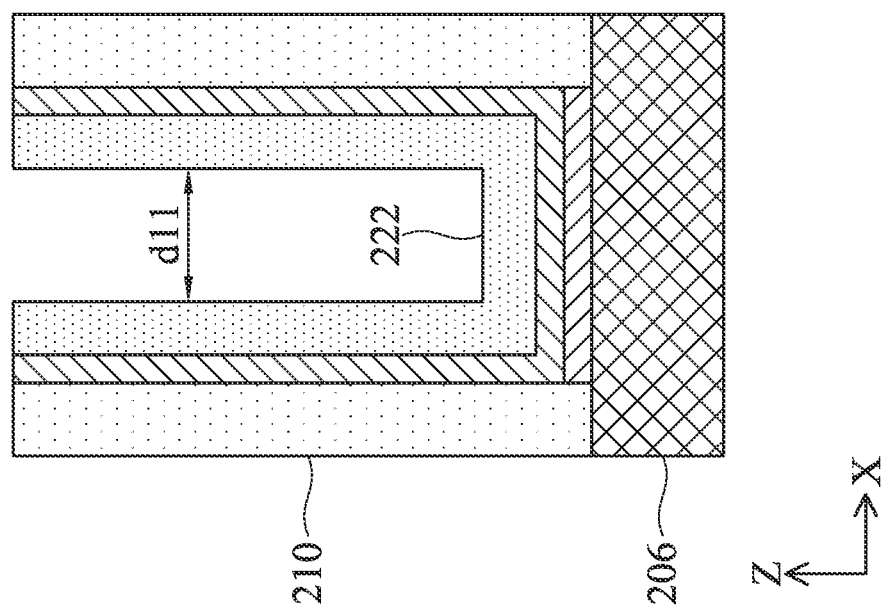

The method 100 then proceeds to block 108 where a metal layer is deposited over the high-k dielectric layer. Turning to FIGS. 6A and 6B, a metal layer 222 is formed over the multigate device 200, specifically over the high-k dielectric layer 220 in the channel region, wrapping (surrounding) the semiconductor layers 206. In some embodiments, the metal layer 222 may be formed until it merges between adjacent semiconductor layers 206 and between the substrate portion 202 of fin 204 and a bottom semiconductor layer 206. The thickness of the metal layer 222 may be determined by the equation $$\frac{d1 - (1 + 1.5)x2}{2} + 0.5 \text{ nm}.$$

In some embodiments, the metal layer 222 has a thickness of between about 6 nm to about 8.5 nm. This thickness guarantees that the metal layer 222 will merge between adjacent semiconductor layers 206 while leaving enough space, a tenth distance d10 and an eleventh distance d11, to perform a subsequent etching process as described below. In some embodiments, a first portion of the metal layer 222 is separated from a second portion of the metal layer 222 by the tenth distance d10. In some embodiments, the tenth distance d10 is smaller than the seventh distance d7 by about twice the thickness of the metal layer 222. In some embodiments, the second portion of metal layer 222 is separated from a third portion of metal layer 222 by the eleventh distance d11. In some embodiments, the eleventh distance d11 is about 2 nm. In some embodiments, the eleventh distance d11 is greater than about 2 nm.

In some embodiments, the metal layer 222 may include a p-type work function layer that includes any suitable p-type work function material, such as TiN, TaN, TaSN, Ru, Mo, Al, WN, WCN ZrSi$_2$, MoSi$_2$, TaSi$_2$, NiSi$_2$, other p-type work function material, or combinations thereof. In some embodiments, where the metal layer 222 includes a p-type work function layer, the metal layer 222 can be formed using another suitable deposition process, such as CVD, PVD, HDPCVD, MOCVD, RPCVD, PECVD, LPCVD, ALCVD, APCVD, plating, other deposition process, or combinations thereof.

In some embodiments, the metal layer 222 may include an n-type work function layer that includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, where the metal layer 222 includes an n-type work function layer, the metal layer 222 can be formed using another suitable deposition process, such as CVD, PVD, HDPCVD, MOCVD, RPCVD, PECVD, LPCVD, ALCVD, APCVD, plating, other deposition process, or combinations thereof.

In some embodiments, the metal layer 222 may include two different metal layers. For example, in some embodiments, a first metal layer may be a p-type work function layer and a second metal layer may be an n-type work function layer that is deposited on the first metal layer. In some embodiments, the first metal layer may be an n-type work function layer and the second metal layer may be a p-type work function layer that is deposited on the first metal layer. In some embodiments, the first metal layer does not merge between adjacent semiconductor layers 206, but the second metal layer merges between adjacent semiconductor layers 206.

Figure 7B:
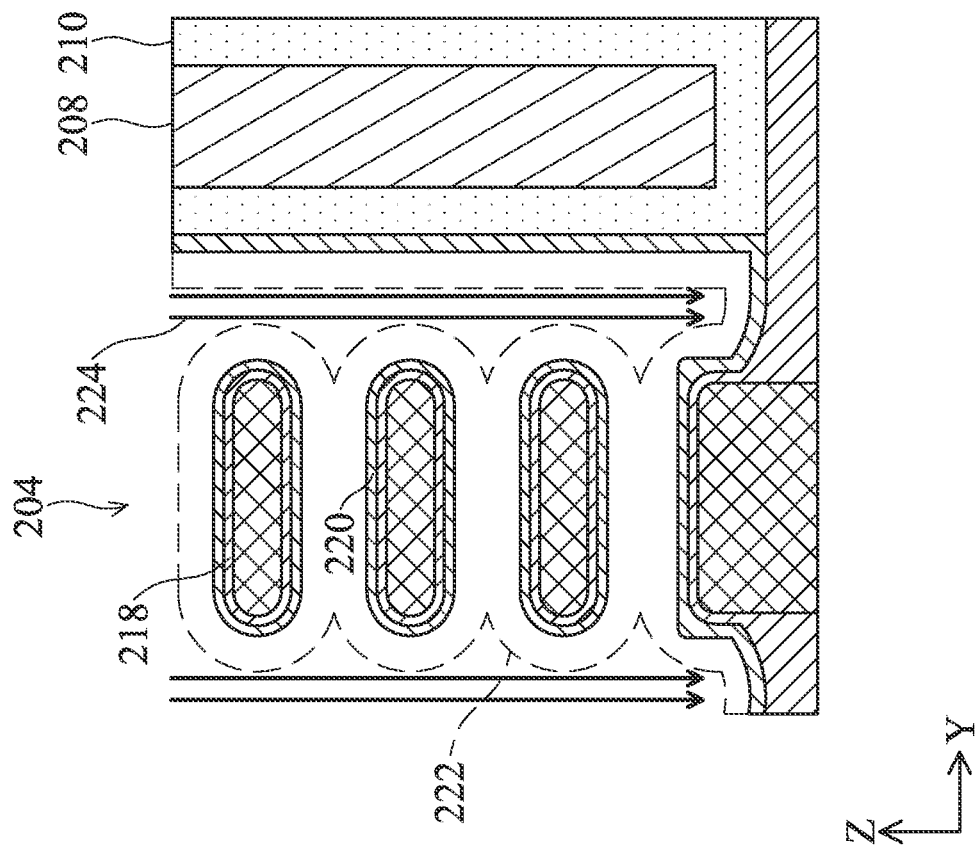
Figure 7A:
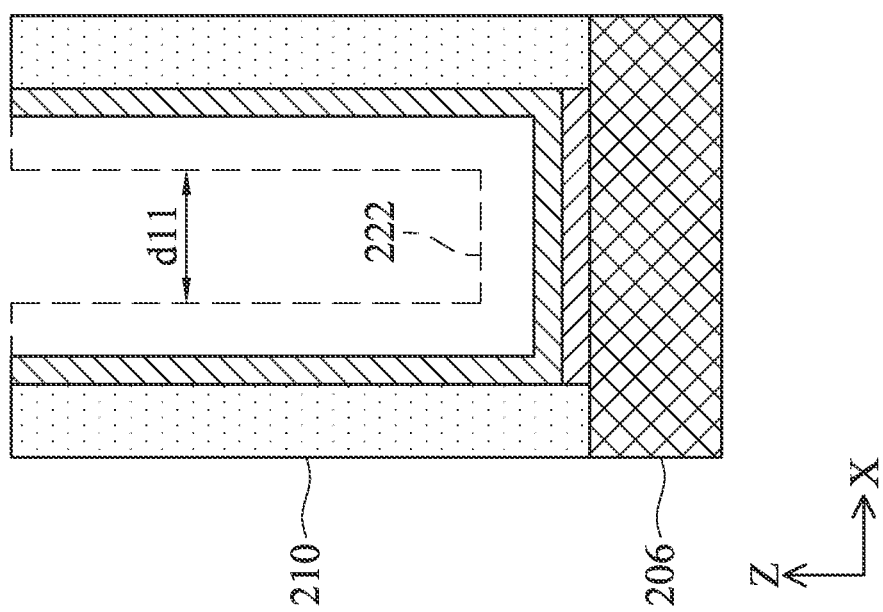

The method 100 then proceeds to block 110 where the metal layer is removed. Turning to FIGS. 7A and 7B, an etching process 224 is performed to remove the metal layer 222. In some embodiments, the etching process is a wet etching process that uses an etching solution having a high etching selectivity with respect to metal layer 222. In some embodiments, the wet etching process implements one or more wet etch chemicals to selectively etch the metal layer 222. Parameters of the etching process are controlled to ensure complete removal of the metal layer 222, such as etching temperature, etching solution concentration, etching time, other suitable wet etching parameters, or combinations thereof. For example, an etching time (i.e., how long the metal layer 222 is exposed to the wet etching solution) is tuned to completely remove metal layer 222 with minimal (to no) etching of the high-k dielectric layer 220. In the depicted embodiment, the metal layer 222 is completely removed leaving high-k dielectric layer 220 exposed. In some embodiments, where metal layer 222 includes a first metal layer and a second metal layer, only the second metal layer is removed, leaving the first metal layer exposed. In some embodiments, the metal layer 222 is removed from a first device region (e.g. region $V_{t1}$) while metal layer 222 is not removed from a second device region (e.g. region $V_{t2}$). In various examples, removal of the metal layer 222 from the first device region results in the different threshold voltages in each of the regions $V_{t1}$ and $V_{t2}$. In some embodiments, a patterned mask layer is formed over the second device region (e.g. region $V_{t2}$), to protect the second device region during the etching process used to remove the metal layer 222 from the first device region. In such embodiments, after the etching process, the patterned mask layer can be removed, for example, by a resist stripping process or other suitable process.

Generally, the multigate device 200 may undergo further processing to form various features and regions known in the art. For example, further processing may form various contacts/vias/lines and multilayer interconnect features (e.g., metal layers and interlayer dielectrics) on the substrate 202, configured to connect the various features to form a functional circuit that may include one or more multigate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be modified, replaced, or eliminated in accordance with various embodiments of the method 100.

As discussed above, the vertical (e.g. along the Z-direction) distance between semiconductor layers 206, the horizontal (e.g. along the Y-direction) distance between semiconductor layers 206 and dielectric fin 208, and the horizontal (e.g. along the X-direction) distance between a first gate spacer 210 and a second gate spacer 210 are important to the self-aligning etch process 224. The specified distances allow metal layer 222 to be completely removed without over etching other regions of the multigate device 200. The specified distances above further allow for etching metal layer 222 without extra photolithography steps. An additional benefit of the process disclosed above is decreased cell spacing in design layout, allowing more features to be formed in the same amount of space.

An exemplary method of the present disclosure includes providing a fin extending from a substrate, the fin having a plurality of semiconductor layers. There is a first distance between each of the adjacent semiconductor layers. The method further includes providing a dielectric fin extending from the substrate and adjacent to the plurality of semiconductor layers. There is a second distance between an end of each of plurality of semiconductor layers and the dielectric fin. The second distance is greater than the first distance. In some embodiments, the first distance is measured along a first direction and the second distance is measured along a second direction where the first direction is perpendicular to the second direction. The method further includes depositing a dielectric layer over the plurality of semiconductor layers and over the first sidewall of the dielectric fin. In some embodiments, depositing the dielectric layer includes forming an interfacial layer over the plurality of semiconductor layers and depositing a high-k dielectric layer over the interfacial layer. In some embodiments, a first gate spacer is formed adjacent the first sidewall of the dielectric fin and a second gate spacer is formed adjacent a second, opposing sidewall of the dielectric fin before depositing the dielectric layer. In such embodiments, there is a third distance measured along a third direction between the first gate spacer and the second gate spacer where the third direction is perpendicular to both the first direction and the second direction. The method further includes forming a first metal layer over the dielectric layer where the first metal layer is disposed on and interposing adjacent semiconductor layers are merged together. In some embodiments, a portion of the first metal layer disposed on the end of each of the plurality of semiconductor layers is spaced a third distance from a portion of the first metal layer disposed on the first sidewall of the dielectric fin, forming a trench therebetween. In some embodiments, the third distance is measured along a third direction where the third direction is perpendicular to the first direction and the second direction. In some embodiments, a second metal layer is formed over the dielectric layer before forming the first metal layer. The method further includes removing the first metal layer.

Another exemplary method includes forming a first stack of semiconductor layers extending from a substrate where there is a first distance between adjacent semiconductor layers within the first stack of semiconductor layers. Forming a dielectric fin extending from the substrate where the first stack of semiconductor layers is adjacent a first sidewall of the dielectric fin and there is a second distance between an end of a semiconductor layer of the first stack of semiconductor layers and the first sidewall of the dielectric fin. In some embodiments, the first distance extends in a first direction, the second distance extends in a second direction, and the first direction is perpendicular to the second direction. The method further includes forming a second stack of semiconductor layers extending from the substrate and adjacent a second sidewall of the dielectric fin, the second sidewall opposing the first sidewall where there is the first distance between adjacent semiconductor layers of the second stack of semiconductor layers. The method further includes depositing a metal layer over the first stack of semiconductor layers, the second stack of semiconductor layers, and the dielectric fin. In some embodiments depositing the metal layer occurs until the metal layer merges between a first semiconductor layer of the first stack of semiconductor layers and an adjacent second semiconductor layer of the first stack of semiconductor layers. In some embodiments, the metal layer is a first metal layer and a second metal layer is formed over the first metal layers, a mask is formed over the second metal layer, and etching the mask over the first stack of semiconductor layers to expose the second metal layer and etching the second metal layer to expose the first metal layer. In some embodiments, the method further includes forming a gate dielectric over the first stack of semiconductor layers and the second stack of semiconductor layers before depositing the metal layer. In some embodiments, forming the gate dielectric layer includes depositing an interfacial layer over the first stack of semiconductor layers and the second stack of semiconductor layers and depositing a high-k dielectric layer over the interfacial layer. In some embodiments the method further includes forming a first gate spacer adjacent a third sidewall of the dielectric fin and forming a second gate spacer adjacent a fourth sidewall that opposes the third sidewall where there is a third distance between the first gate spacer and the second gate spacer.

An exemplary device includes a dielectric fin extending from a substrate. A first channel layer disposed over the substrate and adjacent a first sidewall of the dielectric fin. A second channel layer disposed over the first channel layer where there is a first distance between the first channel layer and the second channel layer. A third channel layer disposed over the substrate and adjacent an opposing second sidewall of the dielectric fin where there is a second distance between the second sidewall of the dielectric fin and an end of the third channel layer. In some embodiments, the first distance is measured along a first direction, the second distance is measured along a second direction, and the first direction is perpendicular to the second direction. In some embodiments, the second distance is larger than the first distance. In some embodiments, a first metal layer is disposed over the first channel layer, the second channel layer, and the third channel layer and a second metal layer is disposed over the third channel layer. In some embodiments, the first metal layer is different than the second metal layer. In some embodiments, a dielectric layer is disposed between the first channel layer and the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin structure disposed on a substrate, the fin structure including a stack of semiconductor layers that are separated from each other;
   a dielectric fin disposed on the substrate;
   a spacer layer disposed on a sidewall of the dielectric fin and extending below the dielectric fin such that the spacer layer prevents the dielectric fin from interfacing with the substrate;

an interfacial layer wrapping around each semiconductor layer of the stack;
a gate dielectric layer disposed on the interfacial layer wrapping around each semiconductor layer of the stack, the gate dielectric layer extending to the spacer layer disposed on the sidewall of the dielectric fin; and
a gate electrode layer including a first portion wrapping around the gate dielectric layer disposed on the interfacial layer and a second portion extending along the spacer layer disposed on the sidewall of the dielectric fin, wherein an airgap extends between the first portion of the gate electrode layer and the second portion of the gate electrode layer,
wherein the fin structure includes a portion of the substrate having a top surface, and
wherein the airgap extends below the top surface of the portion of the substrate.

2. The device of claim 1, wherein the interfacial layer interfaces with the top surface of the portion of the substrate.

3. The device of claim 1, wherein the substrate includes a surface that extends from the portion of the substrate to under the dielectric fin, and
wherein the gate dielectric layer interfaces with the surface.

4. The device of claim 1, wherein the stack of semiconductor layers includes a first semiconductor layer that is adjacent to a second semiconductor and separate by a first distance, the first distance being measured in a first direction that is substantially perpendicular to a top surface of the substrate,
wherein the spacer layer is separated from one of the first and second semiconductor layers by a second distance, the second distance being measured in a second direction that is substantially parallel to the top surface of the substrate, and
wherein the second distance is at least 2 nm greater than the first distance.

5. The device of claim 1, wherein the gate electrode layer includes a first electrode layer having a first type of conductivity and a second electrode layer having a second type of conductivity that is opposite the first type of conductivity.

6. The device of claim 1, wherein the spacer layer extends from the substrate along an entire length of a sidewall surface of the dielectric fin.

7. The device of claim 1, wherein the gate dielectric layer extends from the substrate along an entire length of a sidewall surface of the spacer layer.

8. The device of claim 1, wherein the dielectric fin comprises SiCN, SiOC, SiOCN, $HfO_2$, $ZrO_2$, $HfAlO_x$, $HfSiO_x$, or $Al_2O_3$.

9. A device comprising:
a substrate having a protrusion;
a first elongated semiconductor layer disposed over the protrusion;
a second elongated semiconductor layer disposed over the first elongated semiconductor layer, wherein the second elongated semiconductor layer is spaced apart from the first elongated semiconductor layer by a first distance measured in a first direction that is substantially perpendicular to a top surface of the substrate;
a dielectric fin disposed on the substrate, the dielectric fin having a first sidewall and an opposing second sidewall such that a bottom surface of the dielectric fin extends from the first sidewall to the second sidewall;
a spacer disposed directly on the first sidewall, the second sidewall and the bottom surface of the dielectric fin, wherein the spacer is separated from one of the first and second elongated semiconductor layers by a second distance, the second distance being measured in a second direction that is substantially parallel to the top surface of the substrate; and
a gate electrode layer including a first portion wrapping around the first and second elongated semiconductor layers and a second portion extending along a sidewall of the spacer, wherein an airgap extends between the first portion of the gate electrode layer and the second portion of the gate electrode layer,
wherein top surfaces of the spacer and the dielectric fin are coplanar.

10. The device of claim 9, further comprising:
an interfacial layer wrapping around the first and second elongated semiconductor layers, wherein the interfacial layer does not extend to the spacer; and
a gate dielectric layer disposed on the interfacial layer wrapping around the first and second elongated semiconductor layers and extending continuously to the sidewall of the spacer.

11. The device of claim 10, wherein the gate dielectric layer, the first portion of the gate electrode layer, and the second portion of the gate electrode layer extend to the same height above the substrate.

12. The device of claim 9, wherein the gate electrode layer includes a p-type work function layer selected from the group consisting of TiN, TaN, TaSN, Ru, Mo, Al, WN, WCN $ZrSi_2$, $MoSi_2$, $TaSi_2$, and $NiSi_2$.

13. The device of claim 9, wherein the gate electrode layer includes a n-type work function layer selected from the group consisting of Ti, Al, Ag, Mn, Zr, TiAl, TiAlC, TiAlSiC, TaC, TaCN, TaSiN, TaAl, TaAlC, TaSiAlC, and TiAlN.

14. The device of claim 9, wherein the spacer and the dielectric fin extend to the same above the substrate.

15. A device comprising,
a dielectric fin extending over a substrate;
a spacer disposed on a sidewall of the dielectric fin and extending below the dielectric fin such that the spacer prevents the dielectric fin from interfacing with the substrate;
a first channel layer disposed over the substrate and adjacent a first sidewall of the dielectric fin;
a second channel layer disposed over the first channel layer, wherein there is a first distance between the first channel layer and the second channel layer;
a third channel layer disposed over the substrate and adjacent an opposing second sidewall of the dielectric fin, wherein there is a second distance between the second sidewall of the dielectric fin and an end of the third channel layer;
a first metal layer disposed over the first channel layer, the second channel layer, and the third channel layer; and
a second metal layer disposed over the third channel layer.

16. The device of claim 15, wherein the first distance is measured along a first direction, wherein the second distance is measured along a second direction, and wherein the first direction is perpendicular to the second direction.

17. The device of claim 16, wherein the second distance is at least 2 nm greater than the first distance.

18. The device of claim 15, wherein the first metal layer is different than the second metal layer.

19. The device of claim 15, further comprising:
a dielectric layer disposed between the first channel layer and the first metal layer.

20. The device of claim 15, wherein top surfaces of the dielectric fin and the spacer are coplanar.

\* \* \* \* \*